United States Patent
Gambino et al.

[11] Patent Number: 6,124,199
[45] Date of Patent: Sep. 26, 2000

[54] METHOD FOR SIMULTANEOUSLY FORMING A STORAGE-CAPACITOR ELECTRODE AND INTERCONNECT

[75] Inventors: Jeffrey P. Gambino, Gaylordsville, Conn.; Gary B. Bronner, Stormville, N.Y.; David E. Kotecki, Hopewell Junction, N.Y.; Carl J. Radens, LaGrangeville, N.Y.

[73] Assignee: International Business Machines Corporation, Armonk, N.Y.

[21] Appl. No.: 09/300,900

[22] Filed: Apr. 28, 1999

[51] Int. Cl.⁷ .............................................. H01H 21/4763
[52] U.S. Cl. ........................... 438/622; 438/396; 438/399; 438/239; 438/241; 438/253; 257/239; 257/396
[58] Field of Search ..................................... 438/622, 396, 438/399, 239, 241, 253; 257/306

[56] References Cited

U.S. PATENT DOCUMENTS

| | | |
|---|---|---|
| 3,988,824 | 11/1976 | Bodway . |
| 4,905,064 | 2/1990 | Yabu et al. . |
| 4,958,325 | 9/1990 | Nakagome et al. . |
| 4,980,860 | 12/1990 | Houston et al. . |
| 5,012,447 | 4/1991 | Matsuda et al. . |
| 5,014,110 | 5/1991 | Satoh . |
| 5,130,267 | 7/1992 | Kaya et al. . |
| 5,144,583 | 9/1992 | Oowaki et al. . |
| 5,162,258 | 11/1992 | Lemnios et al. . |
| 5,202,575 | 4/1993 | Sakai . |
| 5,214,601 | 5/1993 | Hidaka et al. . |
| 5,292,678 | 3/1994 | Dhong et al. . |
| 5,395,782 | 3/1995 | Ohkoda et al. . |
| 5,397,729 | 3/1995 | Kayanuma et al. . |
| 5,399,890 | 3/1995 | Okada et al. ............................ 257/306 |
| 5,406,512 | 4/1995 | Kagenishi . |
| 5,416,734 | 5/1995 | Hidaka et al. . |
| 5,420,816 | 5/1995 | Ogihara et al. . |
| 5,475,643 | 12/1995 | Ohta . |
| 5,550,769 | 8/1996 | Hidaka et al. . |
| 5,563,762 | 10/1996 | Leung et al. . |
| 5,583,068 | 12/1996 | Jones, Jr. et al. . |
| 5,586,072 | 12/1996 | Longway et al. . |
| 5,602,772 | 2/1997 | Nakanao et al. . |
| 5,615,156 | 3/1997 | Yoshida et al. . |
| 5,618,749 | 4/1997 | Takahashi et al. . |
| 5,637,526 | 6/1997 | Song . |
| 5,689,126 | 11/1997 | Takaishi ................................. 257/306 |
| 5,716,881 | 2/1998 | Liang et al. ............................ 438/238 |

OTHER PUBLICATIONS

Lee et al, "A Process Technology for 1 Giga–Bit DRAM", IEDM, IEEE 1995, pp. 907–910, Jan. 1995.

*Primary Examiner*—Tom Thomas
*Assistant Examiner*—Nitin Parekh
*Attorney, Agent, or Firm*—Whitham, Curtis & Whitham; Eric W. Petraske, Esq.

[57] ABSTRACT

A DRAM memory cell array includes a wiring layer formed at a storage-capacitor level of the cell for establishing a flipped connection of complementary bit lines, or for connecting support circuits in a DRAM cell array. The wiring layer includes a lower capacitor electrode and upper capacitor electrode which are formed simultaneously with respective plates of a storage capacitor. Both capacitor electrodes may be used to form distinct interconnections within a DRAM cell array.

9 Claims, 9 Drawing Sheets

METHOD FOR SIMULTANEOUSLY FORMING A STORAGE-CAPACITOR ELECTRODE AND INTERCONNECT

BACKGROUND OF THE INVENTION

1. Field of the Invention

The present invention generally relates to semiconductor memories, and more particularly to structures and methods for forming interconnections within a semiconductor memory.

2. Description of the Prior Art

Generally speaking, there are two types of semiconductor memories. In the first type, data stored in the individual cell locations of the memory cannot be altered. Consequently, these memories are referred to as read-only memories. In the second type, data stored in each cell location can be altered, i.e., are subject to both read and write operations. The latter memories have therefore been called random-access memories.

Random-access memories (RAMS) come in various forms. Static random-access memories (SRAMs), for example, store data as long as they are connected to a power source. They also provide extremely rapid access, but at the cost of substantial power consumption, expense, and wafer space. Dynamic random access memories (DRAMs) use capacitive storage and thus must be re-written or refreshed on a periodic basis. They, however, are more economical and have improved storage density and power consumption requirements compared with SRAMs and thus their advantages have given engineers sufficient incentive to design around their drawbacks. DRAMs, therefore, remain the preferred choice of random-access memory for most chip designers.

Structurally speaking, a DRAM is formed from a plurality of memory cells arranged in the form of a matrix. Each cell includes a storage capacitor and a series-connected transistor, which is controlled by a word line running orthogonally to a pair of bit lines connected to a sense amplifier. To read data from the cell, the word line and sense amplifier are activated to cause the capacitor to output its charge to an associated one of a pair of bit lines. This charge causes a voltage imbalance to occur between the bit lines, which imbalance is amplified by the sense amplifier to a level representing a logical "0" or "1." DRAMs of this type are disclosed, for example, in U.S. Pat. Nos. 5,012,447 and 5,416,734.

One effect which reduces the operational efficiency of a DRAM is noise which is capacitively coupled between adjacent bit lines. This noise, among other things, causes the sense amplifiers of the DRAM to output erroneous logic values. To reduce noise, it is common practice to cross (or "flip") complementary bit lines at one or more locations along their length. Flipping bit lines in this manner reduces capacitive coupling and thus improves the overall accuracy of the memory. U.S. Pat. Nos. 5,550,769, 5,475,643, 5,214,601, 5,014,110, 5,012,447, and 4,980,860 disclose flipped bit-line DRAMs of this type.

DRAMs of the aforementioned type use dedicated wiring layers to form the flipped connections between their bit lines. Dedicated wiring layers are undesirable because they increase the cost and complexity of the fabrication process, as well as reduce integration density. Moreover, the storage capacitors in these DRAMs are often formed in layers beneath the bit lines, which further reduces integration density. U.S. Pat. Nos. 5,602,772 and 5,292678 disclose DRAMs of this type.

Many conventional DRAMs, including those having flipped bit-lines, use stacked capacitors in their cells because of the increased electrode area and node capacitance they provide. The height of these capacitors, however, has proven troublesome because of the additional cost required in patterning their thick lower electrode, which further reduces integration density. The article, S. Sim et al. IEDM, 1996 discloses a conventional DRAM using stacked capacitors.

Attempts have been made to increase the integration density of a DRAM. U.S. Pat. No. 5,406,512 to Kagenishi, for example, proposes to form one electrode of a compensation capacitor from a portion of a bit line. The Kagenishi approach, however, actually decreases integration density because any improvement realized from using a bit line as a capacitor electrode is offset by the presence of compensation capacitors in the first place.

The Inventors of the present invention have recognized that space in the storage-capacitor-electrode level of a DRAM memory cell, for example, in a so-called support region (e.g. where support circuits such as decoders and sense amplifiers are located), has not been used for wiring or interconnection purposes. Using the support area in this manner, e.g., as an area in which connections to support circuits can be routed, would be particularly advantageous in improving the integration of a DRAM memory cell.

SUMMARY OF THE INVENTION

It is a first objective of the present invention to increase the integration density of a semiconductor memory device and simultaneously reduce its manufacturing costs.

It is second objective of the present invention to achieve the first objective by incorporating a wiring layer into an intermediate level of at least one memory cell of the semiconductor memory device and then using that wiring layer as a chip interconnect and/or any one of a variety of other purposes.

It is another objective of the present invention to form the aforementioned wiring layer in a level of a DRAM memory cell where at least one storage capacitor is located, and preferably in a support-circuit region within that level.

It is another objective of the present invention to form a DRAM memory cell having the aforementioned wiring layer, wherein the wiring layer includes at least one extra capacitor electrode formed at the storage-capacitor level of the cell.

It is another objective of the present invention to provide a DRAM memory cell of the aforementioned type, wherein the storage-capacitor level of the memory cell is located between chip interconnects and/or complementary bit lines of the DRAM, thereby increasing integration density compared with conventional DRAMs which use special, dedicated wiring levels to make these interconnections.

It is another objective of the present invention to form a DRAM memory cell of the aforementioned type in a region where bit lines of the DRAM are flipped, and then to use the capacitor electrode of the memory cell to establish a flip connection for at least one of the bit lines.

It is another objective of the present invention to provide a memory cell of the aforementioned type, wherein the capacitor electrode electrically connects one or more support circuits of the DRAM.

It is another objective of the present invention to provide a method for making a DRAM memory cell of the aforementioned type, wherein the capacitor electrode is formed simultaneously with an electrode of at least one of the storage capacitors of the cell, thereby reducing the number of steps and the cost required to make the DRAM.

It is another objective of the present invention to provide a method for making a DRAM memory cell of the aforementioned type, wherein the capacitor electrode and the storage capacitor plates in the cell are made from a same conductive material.

These and other objects of the present invention are achieved by providing a DRAM memory cell having a first layer containing at least one transfer gate, a second layer including a first signal line, a third layer including second signal line, and an intermediate wiring layer between the first and second signal lines. The intermediate wiring layer includes an upper capacitor electrode and a lower capacitor electrode separated by a dielectric. Preferably, the capacitor electrodes are stacked capacitor electrodes made from platinum or iridium.

In one embodiment, the lower capacitor electrode connects the first and second signal lines through a hole formed in the upper capacitor electrode. In another embodiment, only the upper electrode connects the first and second signal lines. In still another embodiment, the lower electrode connects the first and second signal lines, while the upper electrode connects third and fourth signal lines.

The above embodiments are particularly well suited for locally-open globally-folded DRAM bit line architectures. The dual bit line arrangement permits a reduction in minimum cell array area from, for example, 8 lithographic squares to 6 squares (0.75×)

The method of the present invention forms the lower capacitor electrode, upper capacitor electrode, and the dielectric therebetween simultaneously with the respective layers of the storage capacitor, and preferably from the same materials. Further, tungsten studs may be formed to make the connections between the capacitor electrodes and the signal lines. Still further, the upper capacitor electrode is preferably made from a low resistivity material and in accordance with a damascene process.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is, in one respect, a semiconductor memory cell having an intermediate wiring layer for electrically connecting one or more bit lines or interconnects of a memory device. The present invention is, in a second respect, a method for making a memory cell having the aforementioned intermediate wiring layer. All of the embodiments described herein may advantageously be incorporated within and/or used to form the memory cells of a DRAM and are described below in this context. One skilled in the art can appreciate, however, that the invention may also be used in to form the cells of other types of memory technologies.

Figure 1:
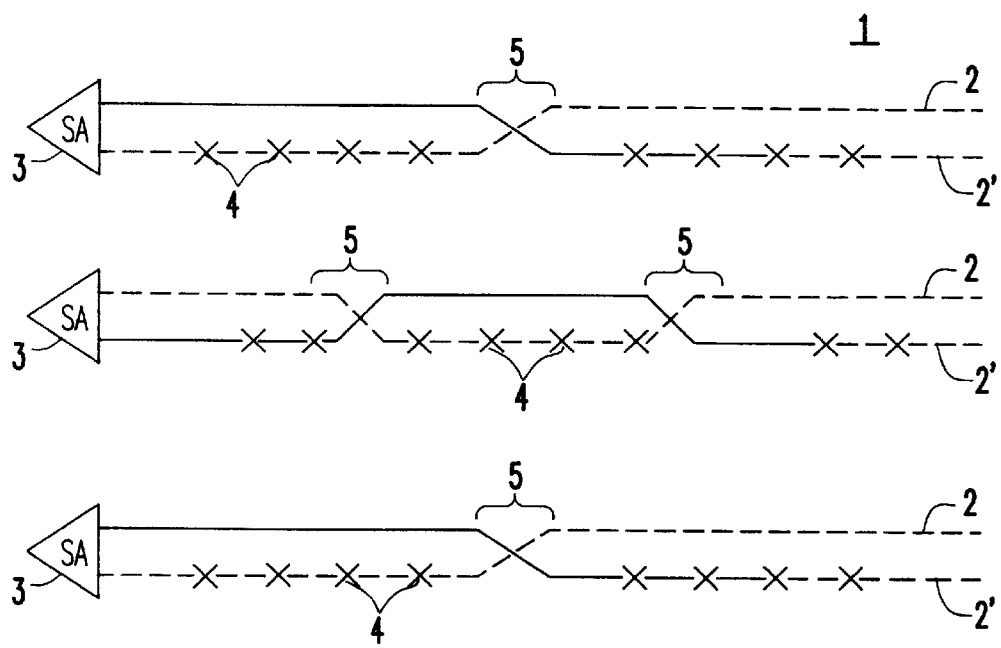
FIG. 1 is a diagram of a DRAM having complementary pairs of bit lines flipped one or more times along their lengths.

Referring now to the drawings, and more particularly to FIG. 1, a DRAM cell array 1 is shown as including a plurality of bit lines 2, 2' grouped in complementary pairs and connected to respective sense amplifiers 3. Disposed at selected locations along the bit lines are memory cells 4, which store data of the cell array at individual address locations. As shown, the bit lines in each pair are crossed (or flipped) in at least one location 5 along their length to minimize the effects of noise derived from capacitive coupling between nearby or adjacent bit lines. (Other elements of the DRAM array, including word lines and associated row/column address decoders, have been omitted from FIG. 1 for the sake of clarity.)

The semiconductor memory cell of the present invention may be included in the device of FIG. 1 to advantageously reduce the overall integration density of the DRAM cell array.

Figure 2:
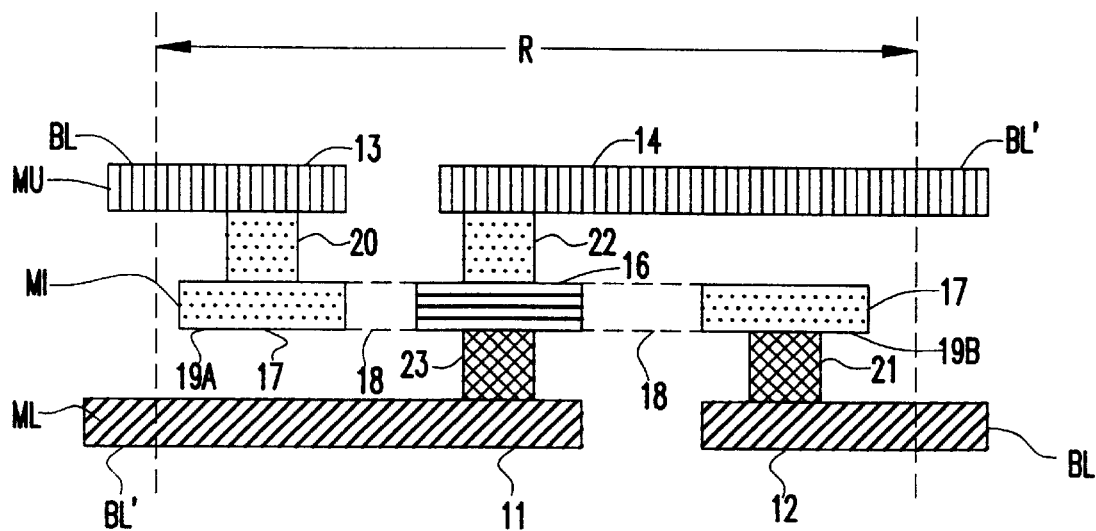
FIG. 2 is a cross-sectional view of the an intermediate wiring layer formed in accordance with the present invention to establish flipped connections between two bit lines.

FIG. 2 is a schematic diagram showing three wiring levels ML, MI, and MU in a first embodiment of the DRAM memory cell 10 of the present invention. Lower wiring level ML includes metal layers 11 and 12, upper wiring level MU includes metal layers 13 and 14, and intermediate wiring level MI, disposed between the upper and lower wiring levels, includes capacitor electrodes 16 and 17. As indicated by hidden lines 18, the ends 19a and 19b of electrodes 17 are connected by a metallization layer formed behind capacitor electrode 16. (The transfer gates, storage capacitors, and other features of the memory cell have been omitted in FIG. 2 for the sake of illustrating the intermediate wiring layer.)

The memory cell of the invention differs, in at least one way, from conventional memory cells by this intermediate wiring level. Specifically, capacitor electrodes 16 and 17 are formed on the same level as a storage capacitor of the cell, preferably in a region where support circuits are located. In accordance with the invention, the capacitors electrodes define a wiring layer in this level for connecting metal layers 11–14 at different levels of the cell. Because the electrodes are formed between the metal layers which they connect, the integration density of the memory cell and thus the overall DRAM device is increased compared with those conventionally known.

The memory cell structure shown in FIG. 2, more specifically, may be used to establish electrical connections in at least three contexts. In the first context, metal layers 12 and 13 and metal layers 11 and 14 respectively form a pair of complementary bit lines BL and BL' which are flipped in a region R through electrical connections running through storage electrodes 16 and 17. To establish the flip connection of bit line BL, a stud 20 electrically connects metal layer 13 to end 19a of capacitor electrode 17, and to complete the connection, a stud 21 electrically connects end 19b of capacitor electrode 17 to metal layer 12. Similarly, to establish the flip connection of bit line BL', studs 22 and 23 electrically connect capacitor electrode 16 to metal layers 14 and 11, respectively.

In the second context, one of capacitor electrodes 16 and 17 is used as a wiring layer for connecting an interconnect 14 to an interconnect 11. Under these circumstances, for example, capacitor 16 may connect the memory cell in which it is incorporated to one or more support circuits of the DRAM cell array (e.g., sense amplifier, word lines, row/column address decoders, etc.), or capacitor 16 may interconnect elements dis-associated with the memory cell per se. In this latter application, capacitor 16 may interconnect two support circuits in the DRAM cell array, interconnect a support circuit to logic device in the array, or connect a support circuit of the array to one or more off-chip logic or input/output devices.

In the third context, both capacitor electrodes are used to perform both types of connections discussed above, e.g., capacitor electrode 16 may be used to establish a flip connection between a bit line formed from metal layers 11 and 14 and capacitor electrode 17 may electrically connect support circuits in the array through interconnects 12 and 13.

In the foregoing figures, the bit lines of the DRAM cell array have been described as being disposed in different vertical planes, or levels, of the cell. Those skilled in the art can appreciate, however, that the intermediate wiring layers of the present invention may be applied, by analogy, when the bit lines are arranged side-by-side within the same vertical plane.

In conventional DRAM memory cell structures, additional wiring levels must be added to the cross-sectional topology of the cell in order to establish flipped bit-line connections. The present invention represents a substantial improvement over these conventional structures by connecting bit lines in the flipped region using the existing levels and more specifically the intermediate storage-capacitor level of the memory cell. Thus, with the present invention, the bit lines are connected in the flipped region without using additional wiring layers, and for at least this reason, the memory cell of the present invention achieves a greater degree of integration density compared with those conventionally known.

Figure 3:
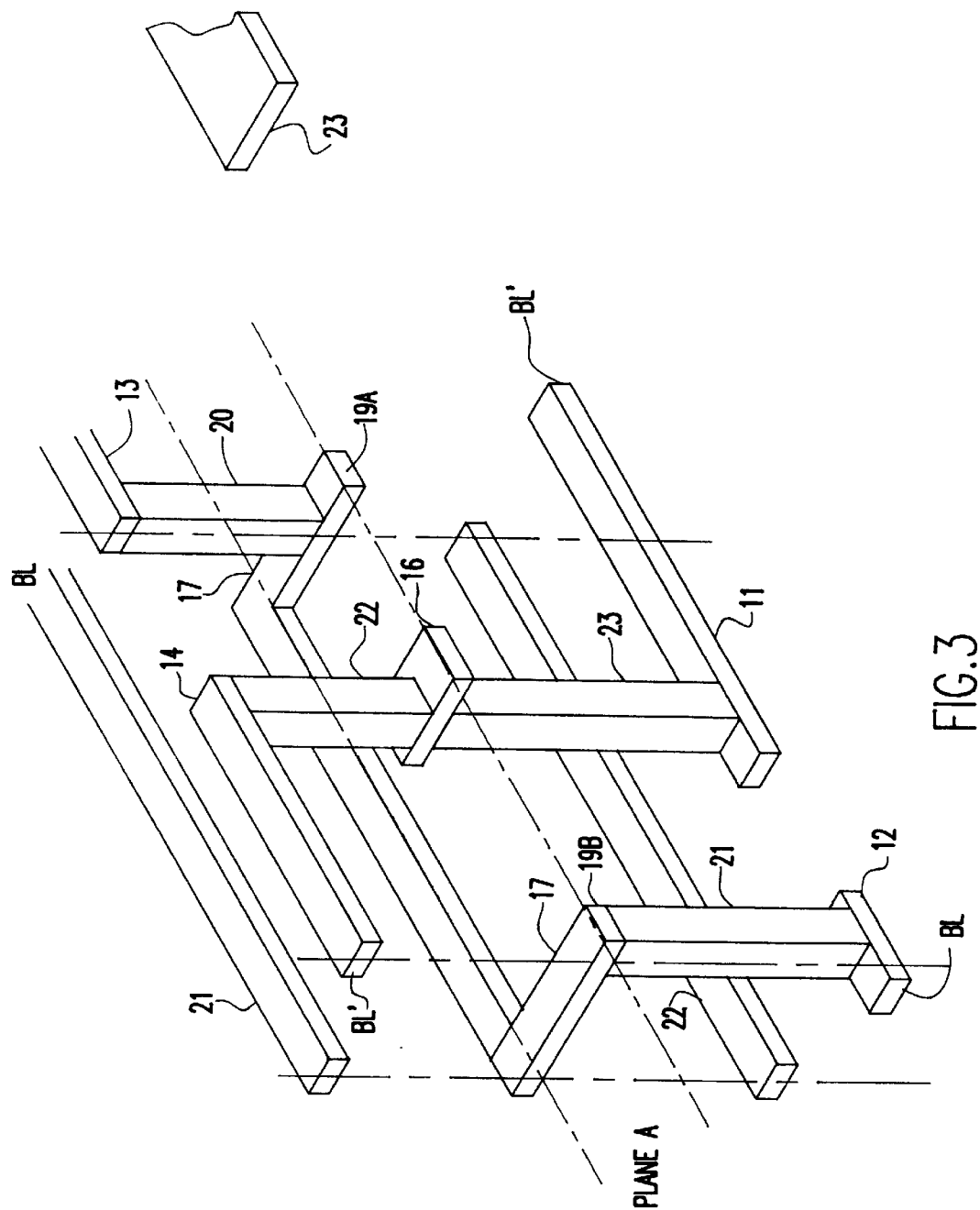
FIG. 3 is three-dimensional view of the bit-line flip connection shown in FIG. 2.

FIG. 3 is a three-dimensional diagram of the wiring levels shown in FIG. 2 and has been included to illustrate a preferred way in which one or more of the capacitor electrodes of the memory cell of the present invention may be constructed. For consistency reasons, FIGS. 2 and 3 use like reference numerals where appropriate.

As shown FIG. 3, the bit line flip connections are made in an intermediate plane A by capacitor electrode 16 and capacitor electrode 17 which partially surrounds electrode 16. Studs 20 and 21 connect portions 12 and 13 of bit line BL, and studs 22 and 23 connect portions 11 and 14 of bit line BL'. Metal layers/bit lines 21 and 22 for a different sense amplifier and lower electrode capacitor 23 are also shown.

Figure 4:
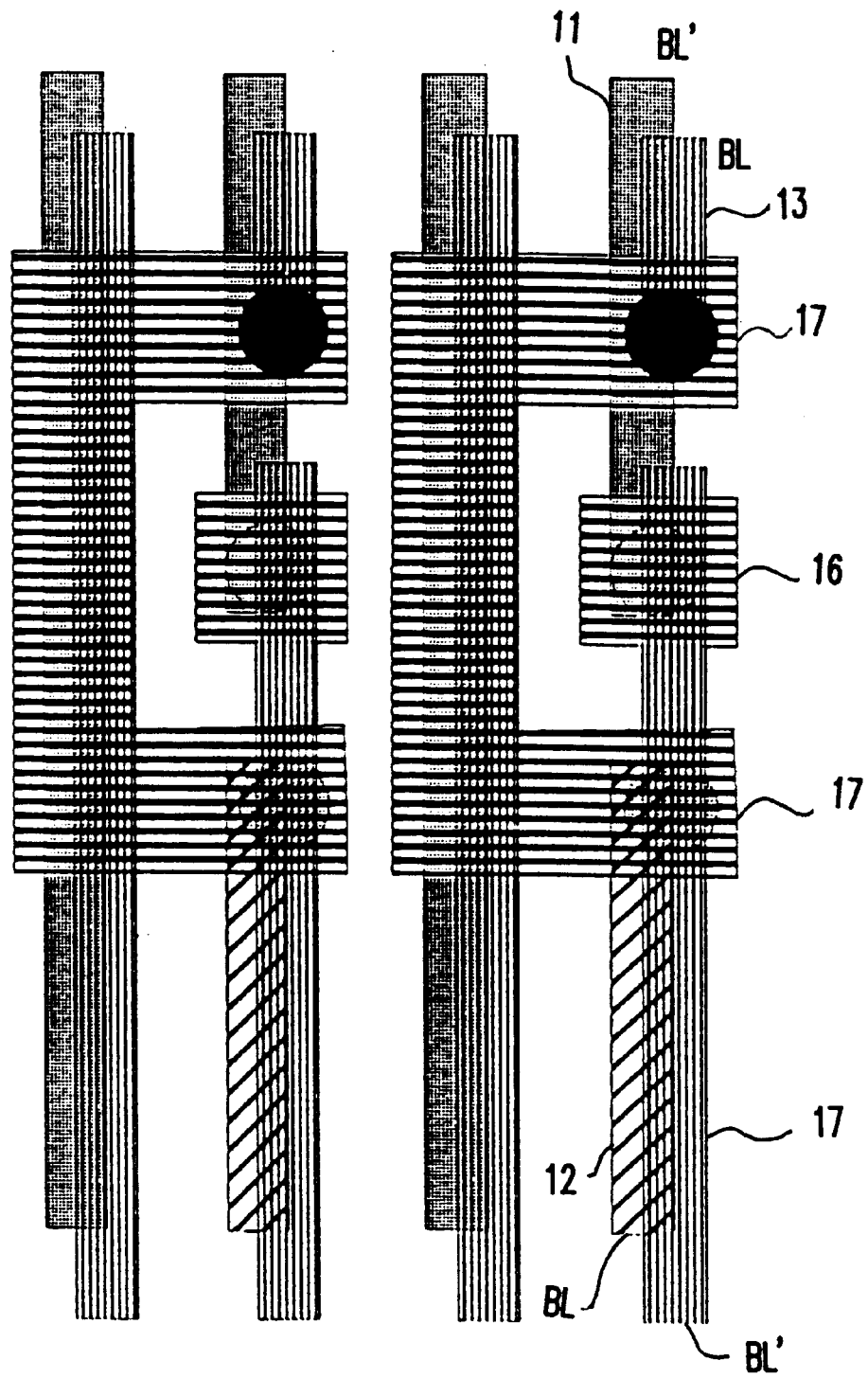
FIG. 4 is a top view of the memory cell as shown in FIG. 3, FIGS. 5(a)–(f) show steps included in a first embodiment of the method of the present invention, and a DRAM cell structure formed in accordance with those steps.

FIG. 4 shows a top view of how the bit lines BL and BL' are connected in the flip region in accordance with the present invention, with like numerals included.

The method for making a DRAM memory cell in accordance with the present invention advantageously forms at least one of the capacitor electrodes previously described on the same level (i.e., within the same vertical plane) as a storage capacitor of the memory cell, thereby avoiding the need for additional or specially dedicated wiring layers for establishing bit-line and other forms of interconnections.

Further, to streamline the cell fabrication process, the capacitor electrode and at least one plate of the storage capacitor are simultaneously formed from a same conductive material. (The term "capacitor electrode" is to be distinguished from "storage capacitor" in that the former refers to a conductive layer which forms the intermediate wiring layer of the present invention. The latter refers to the element which holds the charge, or data, of the memory cell. As will become apparent below, the capacitor electrode and at least one plate of the storage capacitor are preferably formed simultaneously.)

Referring to FIG. 5, a first embodiment of the method of present invention forms a DRAM memory cell having a lower capacitor electrode formed as a wiring layer in an intermediate level of the cell containing two storage capacitors. Preferably, the lower capacitor electrode is a stacked capacitor electrode.

Figure 5A:
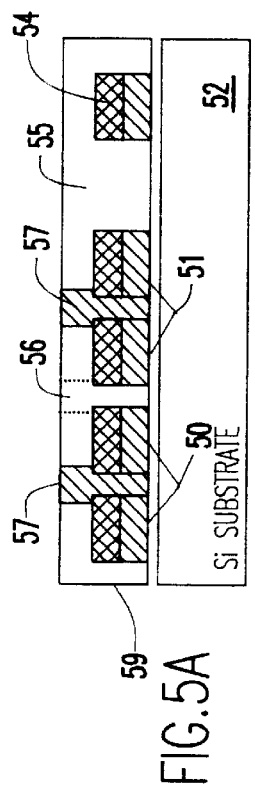

As shown in FIG. 5(a), the method begins by forming transfer gates 50 and 51 (with accompanying spacers and liners) on a silicon substrate 52. The transfer gates control the reading and writing of data to and from storage capacitors formed in subsequent steps of the method. Each transfer gate may be constructed from a polysilicon layer followed by a silicon nitride layer, however one skilled in the art can appreciate that any of a variety of materials may be used to form the transfer gate structures. Also formed on substrate 15 is a transfer gate used for a support device 54.

Next, a layer 55 of borophosphosilicate glass (BPSG) is deposited over the transfer gates and planarized back to a desired thickness using reactive ion etching (RIE) or chemical mechanical polishing (CMP). Array contacts, including bitline contact 56 and capacitor contacts (or studs) 57, are then formed by creating vias in the BPSG layer and then filling them with a conductive material such as doped polysilicon.

Figure 5B:
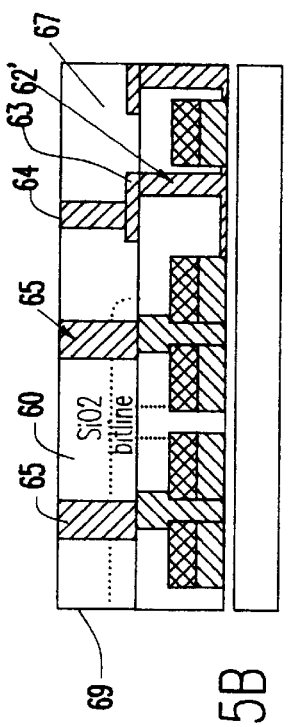

As shown in FIG. 5(b), a dielectric layer 67 of $SiO_2$ is deposited over 55 and interconnect 63 are formed by depositing and patterning a layer of a layer of silicon dioxide ($SiO_2$) 67 to a desired thickness. A contact 62 is then formed in both layers 67 and 55 by lithography and reactive ion etching (RIE).

Next, the contact 62 and trenches (69 and 63) are then filled with W and patterned by a chemical mechanical polishing (CMP) to form dual-damascene metal layers 63 and a contact. Another dielectric layer of $SiO_2$ is then deposited, holes are etched therein and the dielectric layer 67, filled with conductive material, preferably W, and then polished using CMP to form capacitor contacts 65 and support device contact 64.

Figure 5C:
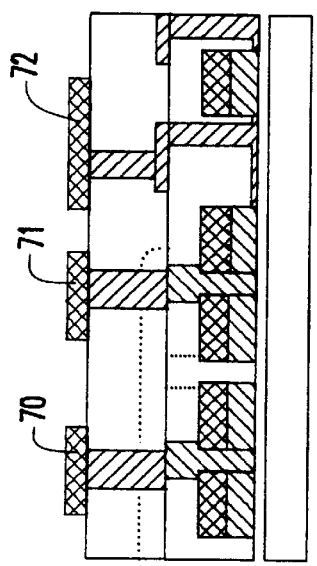
Figure 5D:
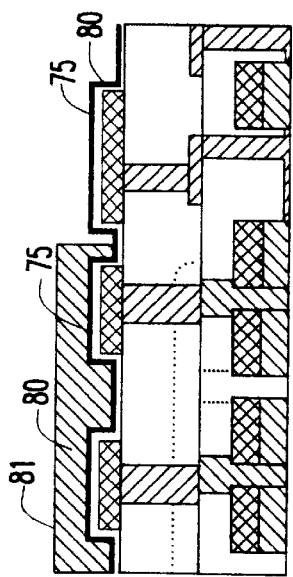
Figure 5E:
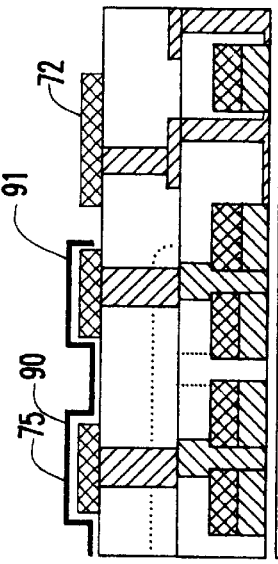
Figure 5F:
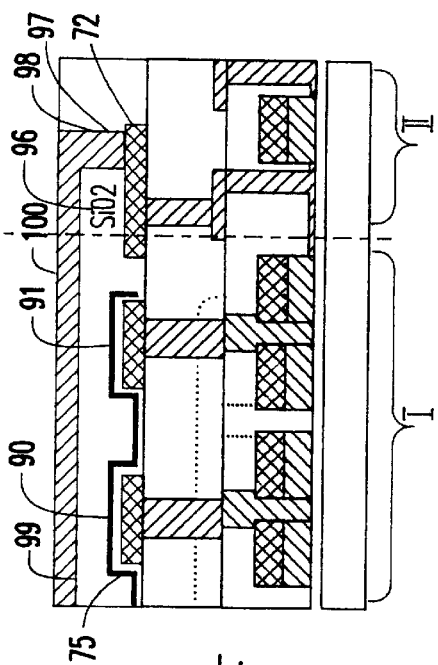
Figure 6A:
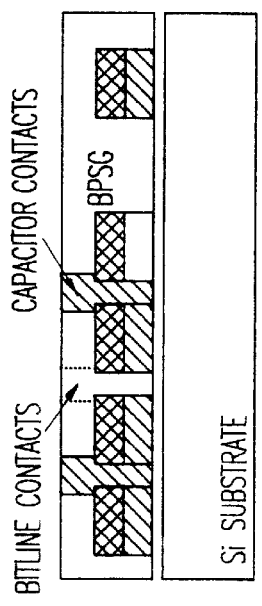
FIGS. 6(a)–(f) show steps included in a second embodiment of the method of the present invention, and a DRAM cell structure formed in accordance those steps.
Figure 6B:
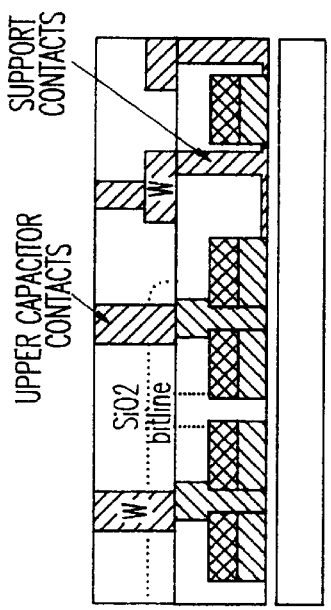
Figure 6C:
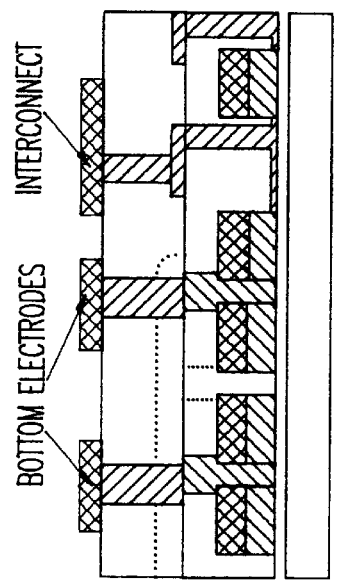
Figure 6D:
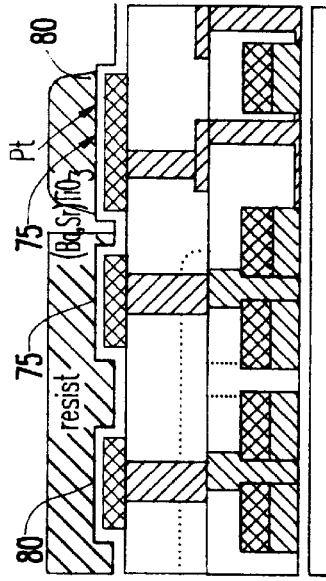
Figure 6E:
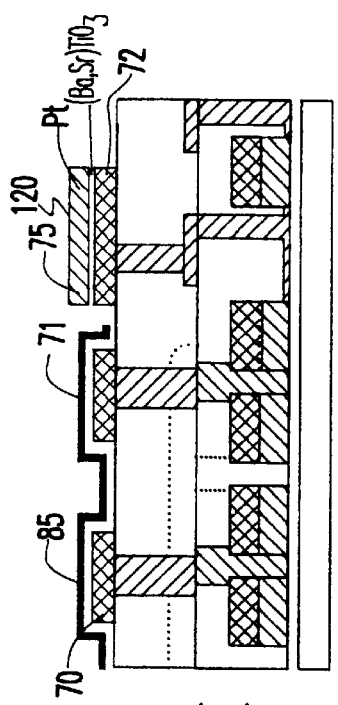
Figure 6F:
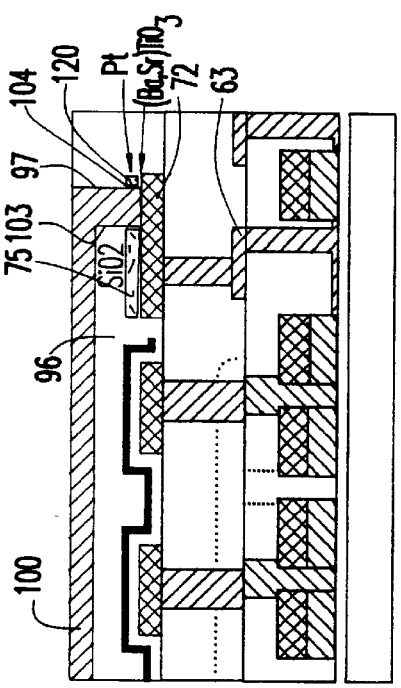

As shown in FIGS. 5(c)–5(e), an intermediate wiring level is formed over wiring level 69. The intermediate wiring level includes a blanket conductor layer which is deposited and patterned by RIE to form three electrodes 70, 71, and 72. See FIG. 5(c). Electrodes 70 and 71 form the lower electrodes of two storage capacitors. Electrode 72 is a capacitor electrode which corresponds to an intermediate wiring layer in accordance with the present invention. Electrodes 70, 71, and 72 are preferably stacked capacitor electrodes and are each deposited to a thickness of between 1000 A to 10,000 A, with 2000 A being preferable. Electrode 72 may serve as an interconnect, for example, for bit lines or support circuits in the DRAM.

As shown in FIG. 5(d), a layer of dielectric material 75 is deposited over electrodes 70, 71, and 72 to a thickness of between 30 A and 500 A. Any one of a variety of materials may be used for dielectric layer 75. If SiON is used, a thickness of 50 A is preferred, and if $(Ba,Sr)TiO_3$ is used, a thickness of 200 A is preferred. In addition, it is noted that the material used to form the blanket conductor layer must be compatible with the dielectric. This material includes polysilicon or suicides for $SiO_2$ or $Si_3N_4$ dielectrics, silicides and TiN for $Ta_2O_5$, and Pt on TiN, or Ir, $IrO_2$, $RuO_2$, and $SrRuO_3$ for $(Ba,Sr)TiO_3$.

After formation of dielectric layer 75, a layer of conductive material 80 is deposited over the dielectric layer and all three electrodes to a desired thickness of between 200 A and 10,000 A, with 1000 A being preferred. As with the blanket layer forming the lower electrodes, the conductive material of layer 80 must be compatible with the dielectric, and as such includes Al, W, Ti, TiN, silicides for $SiO_2$, SiON, or $Si_3N_4$, TiN or silicides for $Ta_2O_5$, Pt, Ir, $IrO_2$, $RuO_2$, and $SrRuO_3$ for $(Ba,Sr)TiO_3$. A resist 81 is then applied over the portion of conductive layer 80 which will serve as the upper electrodes of the storage capacitors, i.e., the portion of layer 80 which is coextensive with lower electrodes 70 and 71. See FIG. 5(*d*).

As shown in FIG. 5(*e*), a common upper electrode 85 for the storage capacitors is formed by patterning layers 75 and 80 in accordance with steps that include dry etching for the common upper electrode 80 and wet or dry etching for the dielectric 75. At the conclusion of the steps in FIGS. 5(*c*)–5(*e*), storage capacitors 90 and 91 are formed, in addition to a lower capacitor electrode 95 which serves as the intermediate wiring layer shown in FIGS. 2 and 3.

As shown in FIG. 5(*f*), formation of a third wiring layer begins by depositing a third $SiO_2$ layer 96 over upper electrode 80 and capacitor electrode 72. The $SiO_2$ layer 96 is planarized by CMP and then patterned using lithography and RIE to form a via 98 and a trench 99. The via and trench are then filled with a metal, preferably aluminum AL, and patterned by CMP to form dual damascene stud 97 and metal layer 100. Capacitor electrode 72 may be characterized as being formed in a section II of the memory cell which corresponds to a support-circuit region, e.g., sense amplifiers, row/column address decoders, etc.

The first embodiment of the method of the present invention, thus, forms a DRAM memory cell having an intermediate wiring level between metal layers (69,63) and 100. This intermediate wiring level includes at least one wiring layer in the form of lower capacitor electrode 72 which electrically connects metal layers 63 and 100.

Metal layers 63 and 100 may be one of a variety chip features. For example, metal layers 63 and 100 may be portions of a bit line disposed on different levels of the DRAM structure. Under these circumstances, electrode 95 may advantageously be used to establish a flipped connection between these bit lines portions. Alternatively, metal layers 63 and 100 may be interconnects attached to one or more support circuits of the DRAM, which are then connected by electrode 72 through studs 97 and 64. Still further, electrode 72 may be used to connect support circuits to a diffusion region or gate electrodes in substrate 52 via elements 64, 63, and 62 where support device 54 may eventually receive the signal.

It is further noted that lower capacitor electrode 72 may correspond to either of 16 or 17 in FIGS. 2 and 3. And, if desired, the structure shown in FIG. 5(*f*) may be modified to include both of electrodes 16 and 17 in the manner shown in FIG. 3, with accompanying studs being formed through levels 59, 69, and 96 behind capacitor electrode 72.

From the foregoing, it is therefore apparent that the lower capacitor electrode of the present invention, as with all other embodiments described herein, may be used for establishing any one of a variety of chip interconnections including local interconnects, within-array bit-line wiring such as bit-line flipping, twisting, and folding, and global wiring.

Referring to FIG. 6, a second embodiment of the method of the present invention forms a DRAM memory cell having an upper capacitor electrode and a lower capacitor electrode formed in an intermediate wiring level of the cell, for example, on a same level as one or more storage capacitors. Preferably, the upper and lower capacitor electrodes are stacked capacitor electrodes. In this embodiment, the steps shown in FIGS. 6(*a*)–(*d*) are similar to the steps in FIGS. 5(*a*)–(*d*) and thus a detailed discussion of them has been omitted. Because of this identity, like references numerals have been used for consistency purposes.

As shown in FIG. 6(*e*), after dielectric and electrode deposition, electrode material 80 and dielectric 75 are patterned, using dry etching for the electrode material and wet or dry etching for the dielectric. This etching process results in the formation of common upper electrode 85 overlying electrodes 70 and 71 vis-a-vis dielectric 75, and the formation of upper capacitor electrode 120 overlying lower capacitor electrode 72 also vis-a-vis dielectric 75. Unlike the first embodiment, because electrode material is left on top of lower capacitor electrode, high etch selectivity between the layers is not required. Preferably, the upper capacitor electrode is made from platinum (Pt) and the dielectric from $(Ba,Sr)TiO_3$. Those skilled in the art can appreciate, however, that $RuO_2$, $SrRuO_3$, $IrO_2$ for (Ba, St) $TiO_3$, TiN or silicides for $Ta_2O_5$, polysilicon, W, TiN for $SiO_2$, $Si_3N_4$ or SiON may also be used for the upper electrode and dielectric.

As shown in FIG. 6(*f*), once the upper and lower capacitor electrodes have been formed, a third $SiO_2$ dielectric layer 96 is deposited and patterned using lithography and RIE. Two etches can be performed to form vias 103 and 104. The first etch penetrates the third dielectric layer to form a via 103 above upper capacitor electrode 120. The second etch is performed through the via to form a hole 104 in upper capacitor electrode 120 and dielectric 75, with the second etch stopping on the top surface of the lower capacitor electrode. The first etch may be, for example, a fluoride-based etch and the second etch a stronger chloride-based etch. A third etch is then performed to form a trench in an upper surface of the third dielectric layer.

Next, a metallization step is performed, during which a conductive material, such as Al, is deposited into the aforementioned vias, holes, and trenches, and then patterned by CMP to form dual damascene metal layer 100 and stud 97, which stud connects metal layer 100 to the lower capacitor electrode 72.

The second embodiment of the present invention, thus, forms a DRAM memory cell structure having an intermediate wiring level between metal layers 63 and 100. This intermediate wiring level is in the form of a layered structure which includes lower capacitor electrode 72, dielectric 72, and upper capacitor electrode 120. In this embodiment, only lower capacitor electrode 95 is used to electrically connect metal layers 63 and 100, which may be bit-lines, support circuits interconnects, or any of the other types of interconnects and global wirings previously discussed. For example, the layered structure of the second embodiment especially well suited for use as either capacitor electrode 16 or 17 forming the flipped bit-line connections shown in FIGS. 2 and 3.

While the upper capacitor electrode 120 is not used as an interconnect in the second embodiment, it nevertheless is beneficial in a number of respects. For example, the upper capacitor electrode advantageously improves the planarity of the overlying dielectric, which in turn improves the yield for subsequent processing, such as lithography, which requires planar surface.

Referring to FIG. 7, a third embodiment of the method of the present invention forms a DRAM memory cell having an upper capacitor electrode and a lower capacitor electrode, wherein only the upper capacitor electrode forms an intermediate wiring layer of the cell, for example, on a same level as one or more storage capacitors. Preferably, the upper and lower capacitor electrodes are stacked capacitor electrodes. In this embodiment, FIGS. 7(*a*)–(*e*) are identical to the steps shown in FIG. 6(*a*)–(*e*) and thus a detailed discussion of these steps has been omitted. Like reference numerals, however, have been used for consistency purposes.

Figure 7A:
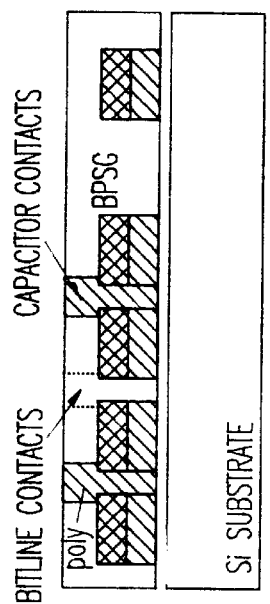
FIGS. 7(a)–(f) show steps included in a third embodiment of the method of the present invention, and a DRAM cell structure formed in accordance with those steps.
Figure 7B:
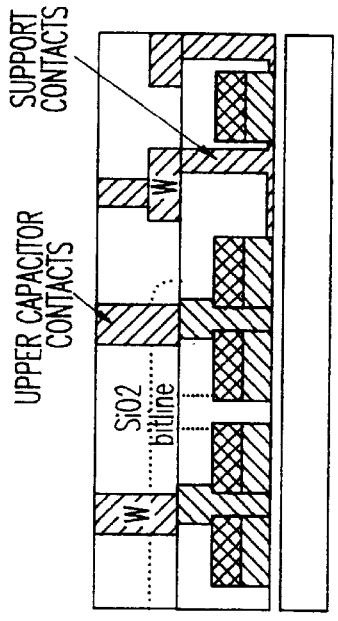
Figure 7C:
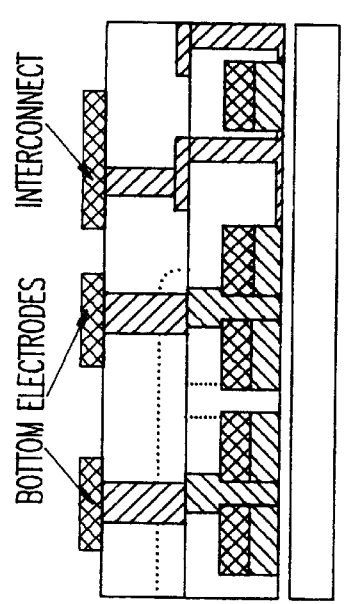
Figure 7D:
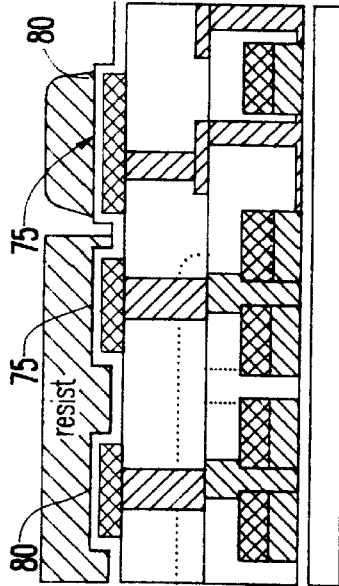
Figure 7E:
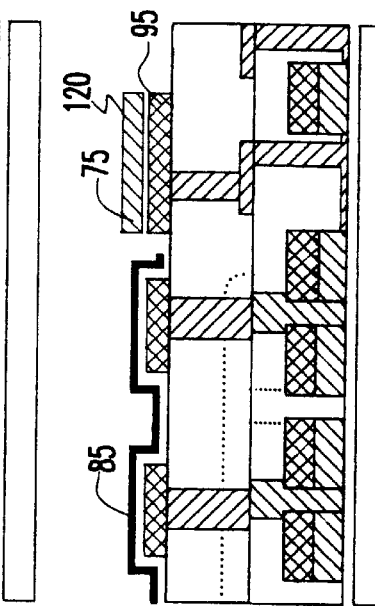
Figure 7F:
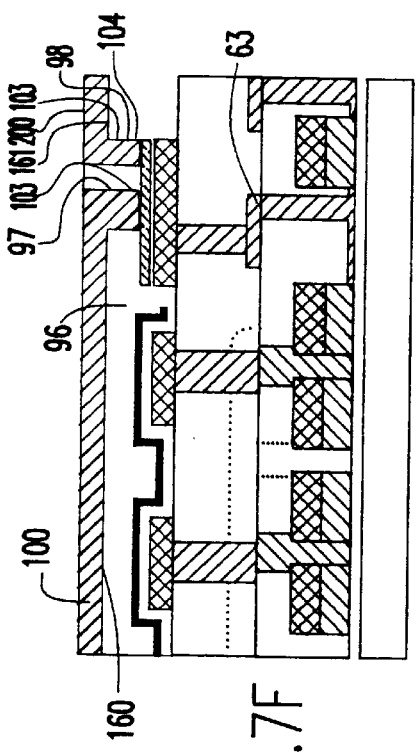

As shown in FIG. 7(f), once the upper and lower capacitor electrodes have been formed, a third SiO$_2$ dielectric layer 96 is deposited. Next, the third dielectric layer is planarized, then patterned by lithography and RIE to form vias 103 and 104 above upper capacitor electrode 120. Unlike the second embodiment, the via etch stops on a top surface of upper capacitor electrode 120. Additional lithography and etching is then performed to form two trenches 160 and 161 in an upper surface of the third dielectric layer. Trench 160 and via 103 and trench 161 and via 104 are then filled with metal and patterned by CMP to form dual damascene metal layers 100 and 200 and studs 97 and 98.

The third embodiment of the present invention, thus, forms a DRAM memory cell structure having an intermediate wiring level connecting metal layers 100 and 200. This intermediate wiring layer is in the form of a layered structure which includes lower capacitor electrode 95, dielectric 75, and upper capacitor electrode 120. In this embodiment, only upper electrode 120 is used to electrically connect metal layers 100 and 200, which may be support circuits interconnects or any of the other types of global wiring previously discussed.

For all embodiments herein, the upper capacitor electrode may be made from platinum (Pt) and the dielectric from (Ba,Sr)TiO$_3$. In selecting these materials, it is noted that there are usually more constraints placed on the choice of materials for the lower electrode than on the upper electrode, for example, because the lower electrode must be able to withstand high temperature annealing. A refractory metal (e.g., one having a high melting point), therefore, is usually selected for the lower electrode. Unfortunately, refractory metals have higher resistivity than desired for global interconnects, e.g., the resistivity of platinum is about 10×10$^{-6}$ ohm-cm, compared with the considerably lower resistance of aluminum which is 2.6×10$^{-6}$ ohm-cm. Hence, the lower electrode is preferably used for local wiring.

Greater flexibility exists in the choice of materials for the upper electrode. As previously discussed, the layer which contacts the capacitor dielectric must be compatible with the dielectric material. For (Ba,Sr)TiO$_3$ dielectrics, for example, platinum or a conducting oxide such as RuO$_3$ may be used. Given this choice of materials, additional layers, if desired, may advantageously be deposited on top of the platinum or RuO$_3$ layers to lower the resistance of the upper electrode, so that the upper electrode can be used for global interconnects.

Figure 8:
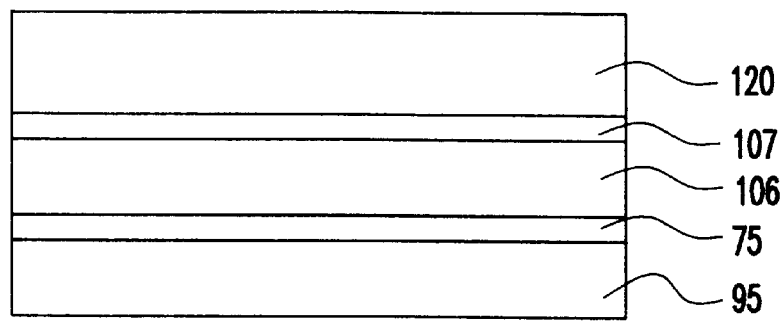
FIGS. 8(a)–(f) show a cross-sectional view of a capacitor electrode having a multi-layered structure.

FIG. 8 shows an illustrative embodiment of a multi-layered structure employing a low-resistivity material for the upper capacitor electrode. In this structure, lower capacitor electrode 95 is made from platinum and dielectric 75 is made from (Ba,Sr)TiO$_3$. Overlying dielectric 75 is another platinum layer 106. To lower the resistance of the upper electrode so that it can be used for global interconnects, it is preferable to deposit a thin TiN diffusion barrier 107 over Pt layer 106, followed by a thick Al layer which would serve as upper electrode 120. Through this arrangement, upper electrode 120 could be used as a global interconnect. Further, the structure of FIG. 8 is particularly desirable for use in embodiments which include both upper and lower electrodes 95 and 120, since the added, intervening layers will reduce the effects of capacitive coupling between the electrodes.

Referring to FIG. 9, a fourth embodiment of the method of the present invention forms a DRAM memory cell having an upper capacitor electrode formed as an intermediate wiring layer by a damascene process. Preferably, the upper and lower capacitor electrodes of this embodiment are stacked capacitor electrodes. Further, in this embodiment, the steps shown in FIGS. 9(a)–(d) are identical to the steps in FIGS. 7(a)–(d), except that in FIG. 9(c) the interconnect may be smaller and in FIG. 9(d) the resist be modified. Otherwise, they are the same and thus a detailed discussion of them has been omitted. Because of this identity, like references numerals have been used for consistency purposes.

Figure 9A:
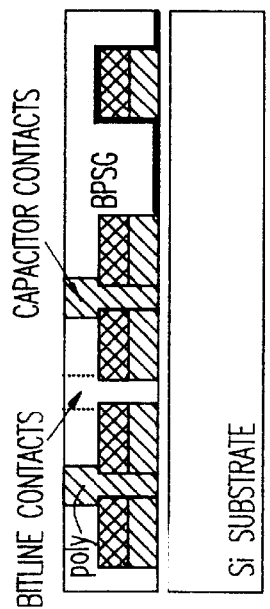
FIGS. 9(a)–(f) show steps included in a fourth embodiment of the method of the present invention, and a DRAM cell structure formed in accordance with those steps.
Figure 9B:
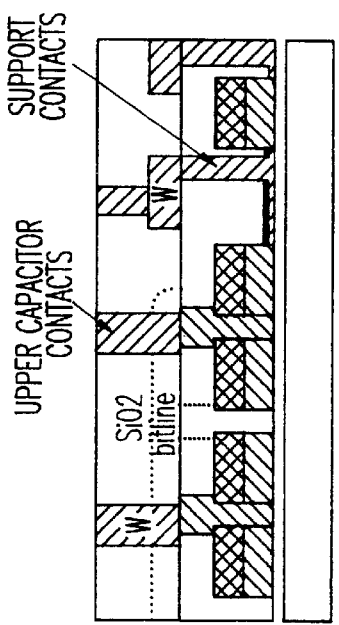
Figure 9C:
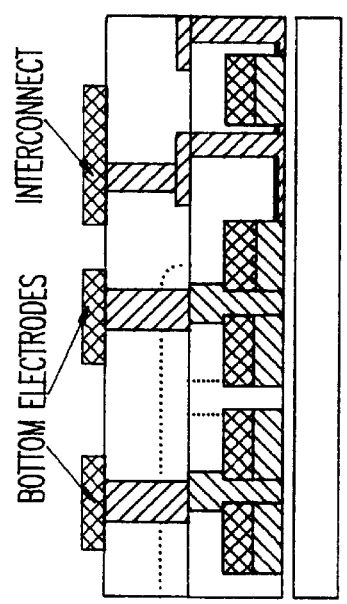
Figure 9D:
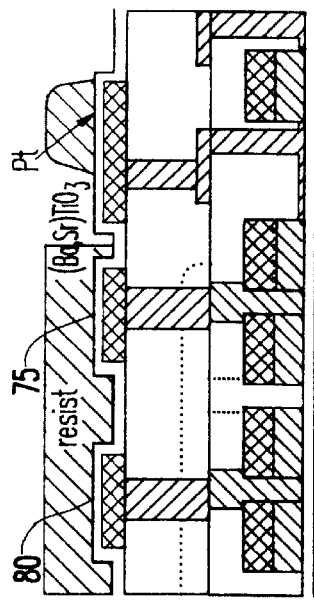
Figure 9E:
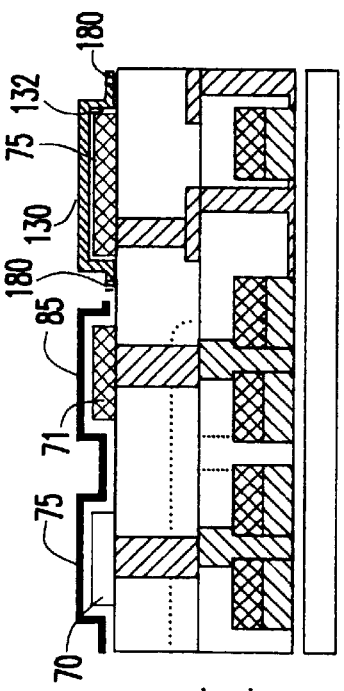

As shown in FIG. 9(e), after dielectric and electrode deposition, electrode material 80 (e.g., Pt) and dielectric 75 are patterned, using dry etching for the electrode material and wet or dry etching for the dielectric. This etching process results in the formation of common upper electrode 85 overlying electrodes 70 and 71 vis-a-vis dielectric 75, and the formation of upper capacitor electrode 130 overlying lower capacitor electrode 95 also vis-a-vis dielectric 75. Another Pt layer is deposited, then etched back to form spacers 180 (e.g., Pt) at the edges of the interconnect. These spacers can be used to connect via 64 to the upper electrode.

If desired, the upper capacitor electrode may have a multilayer stack structure, with the lower layer compatible with the dielectric, an intermediate layer (such as W, TiN, or TaSiN) that is used as a diffusion layer, and an upper layer such as AL or Cu that is used for low resistivity, thick interconnects in the support regions.

Figure 9F:
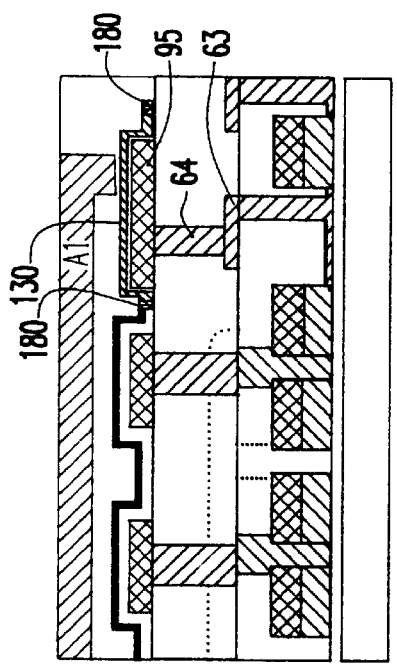

As shown in FIG. 9(f), a third SiO$_2$ dielectric layer 96 is deposited and then patterned using lithography and RIE to form contacts to the support devices and trenches for the interconnects. The contacts and trenches are then filled with Al and patterned by a CMP process to form dual damascene Al contacts and interconnects. Electrical connection between metal layers 100 and 63 is established through the upper capacitor electrode.

Referring to FIG. 10, a fifth embodiment of the method of the present invention forms a DRAM memory cell having an upper capacitor electrode and a lower capacitor electrode which are both used as intermediate wiring layers of the cell. Preferably, both electrodes are stacked capacitor electrodes. In this embodiment, the steps shown in FIGS. 10(a)–(e) are identical to the steps in FIGS. 7(a)–(e) and thus a detailed discussion of them has been omitted. Because of this identity, like references numerals have been used for consistency purposes.

Figure 10A:
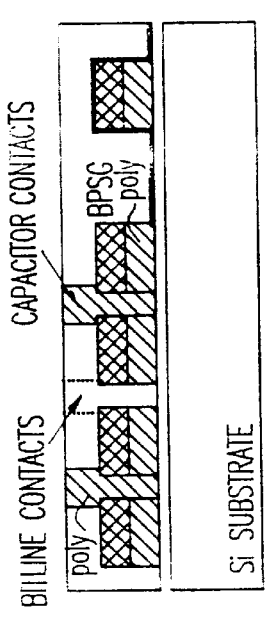
FIGS. 10(a)–(f) shows steps included in a fifth embodiment of the method of the present invention, and a DRAM cell structure formed in accordance with those steps.
Figure 10B:
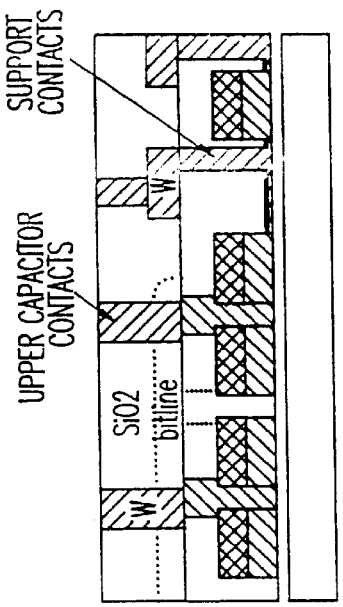
Figure 10C:
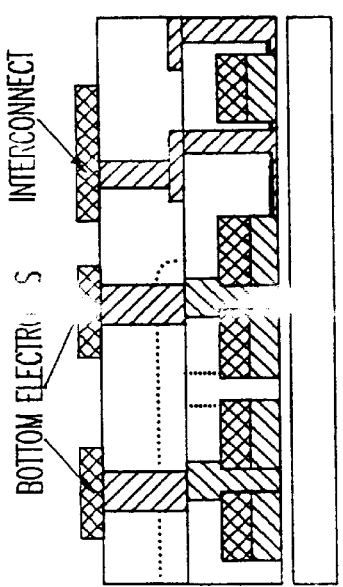
Figure 10D:
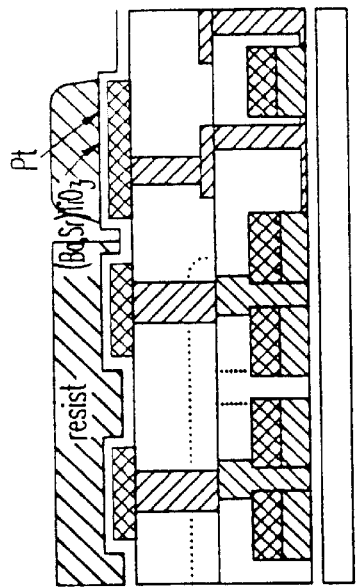
Figure 10E:
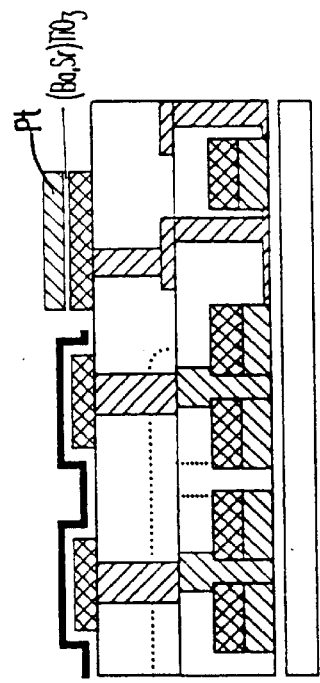
Figure 10F:
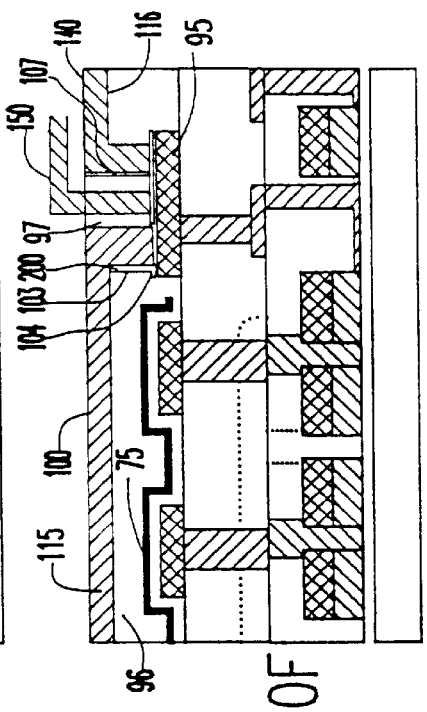

As shown in FIG. 10(f), once upper and lower capacitor electrodes 120 and 95 have been formed, a third SiO$_2$ dielectric layer 96 is deposited, planarized, and patterned using lithography and RIE. Two etches (with a corresponding lithography step) are then performed to form vias. The first etch penetrates the third dielectric layer to form vias 103 and 107 above upper capacitor electrode 120. The second etch is performed through via 103 to form a hole 104 in upper capacitor electrode 120 and dielectric 75, with the second etch stopping on the top surface of the lower capacitor electrode. The first etch may be, for example, a fluoride-based etch and the second etch a stronger chloride-based etch. A third lithography and etch are then performed to form two trenches 115 and 116 in an upper surface of the third dielectric layer.

Next, a metallization step is performed, during which two metal layers (e.g., Al) are deposited in the top surface of the third dielectric 96. (An additional liner may need to be added to prevent 95 from electrically shorting to 120 by path 100. Prior to metallization, a dielectric 200 is thus is formed in vias 103, 104, and 107.) The metal layer is deposited into via 103, hole 104, and trench 115, and then patterned by CMP to form dual damascene metal layer 100 and stud 97, which stud connects metal layer 100 to the lower capacitor electrode. The second metal layer is deposited into trench 116 and via 107 to contact the upper capacitor electrode 95. This second layer may be deposited at the same time as the first metal layer. An additional etching and metallization step is also performed to form metal layer 150 as shown.

Figure 11:
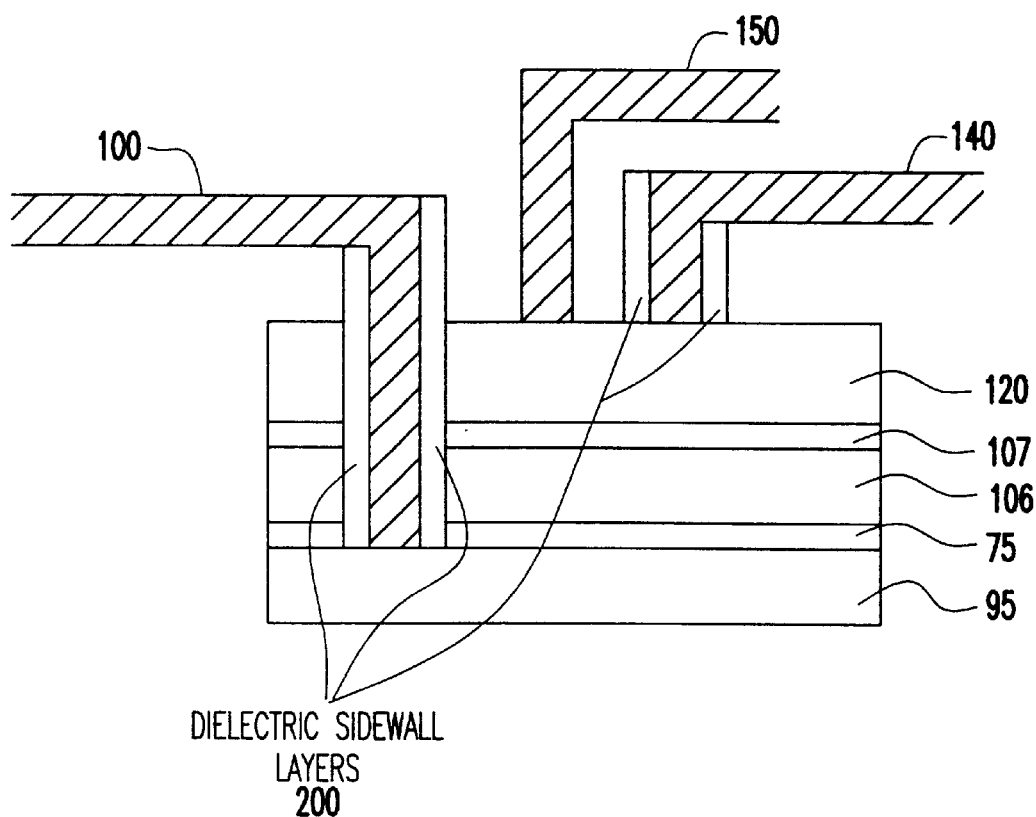
FIG. 11 shows a cross-sectional view of a capacitor electrode formed in accordance with the fifth embodiment having a multi-layered structure.

The fifth embodiment of the present invention, thus, forms a DRAM memory cell structure having two intermediate wiring layers. The first layer is in the form of lower capacitor electrode 95 which connects between metal layers 63 and 100, and the second layer is upper capacitor electrode which connects metal layer 140 to a metal layer 150. Preferably, the upper and lower capacitor electrodes of the fifth embodiment has a structure such as shown in FIG. 11, which may be identical to FIG. 8 insofar as choice of materials is concerned.

The fifth embodiment of the invention thus produces the dual benefits of providing two intermediate wiring layers for establishing different connections. For example, lower electrode 95 may be used to connect bit line portions 63 and 100 at a flipped region, and upper electrode 120 may interconnect support circuits of the DRAM. Further, by including the upper electrode, planarization of the structure may be improved in the manner previously discussed. Further, electrodes 95 and 120 may be varied in shape to provide the additional advantages noted above.

In all embodiments discussed herein, the capacitor dielectric(s) of the present invention may be made from high-temperature (>600° C.) materials such as (Ba, Sr) $TiO_3$ which require non-oxidizing refractory materials for the lower capacitor electrode, such as Pt, with appropriate underlying diffusion barriers. Furthermore, to increase circuit density, the contact studs between the capacitor electrode(s) and diffusions may be made from polysilicon or W.

Accordingly, the lower capacitor electrode of the present invention may be used for a number of purposes other than as interconnects. For example, the lower capacitor electrode may be used (2) as a landing pad during RIE of support contacts and (2) as a diffusion barrier for protecting the contact studs from oxidation during formation of the capacitor dielectric. (Normally, when the lower electrode is not used for wiring or a landing pad, the support contacts are formed after the capacitors, resulting in a very deep contact etch.)

Other advantages are equally apparent. For example, patterning of the capacitor dielectric and the upper electrode are performed simultaneously, thereby eliminating the need to use a mask, which results in a cheaper process. Further, by using a damascene process to form the upper electrode, the metallization formed from the lower electrode is never exposed to RIE (ie., during patterning of the capacitor dielectric) and hence will not suffer from thinning or etch damage associated with RIE. Still further, both the upper and lower capacitor electrodes are used as interconnect wires. Using the upper capacitor electrode provides great flexibility in the choice of conductors.

While the invention has been described in terms of several illustrative embodiment, those skilled in the art will recognize that the invention can be practiced with modification within the spirit and scope of the appended claims.

What is claimed is:

1. A method for making a memory cell, comprising:
    forming a first layer including a transfer gate;
    forming a second layer which includes a first signal line
    forming a third layer which includes a storage capacitor connected to the transfer gate in said first layer, said third layer further being formed by:
        (a) depositing a lower capacitor electrode adjacent said storage capacitor,
        (b) laying a dielectric material over said lower capacitor electrode, and
        (c) depositing an upper capacitor electrode over said dielectric material and said lower capacitor electrode;
    depositing a second signal line on said third layer; and
    connecting said first signal line and said second line through one of said lower capacitor electrode and said upper capacitor electrode.

2. The method of claim 1, wherein said step of forming said third layer includes:
    forming said lower capacitor electrode and a first electrode of said storage capacitor simultaneously in a same plane.

3. The method of claim 1, wherein a dielectric of said storage capacitor is made from a same material as said dielectric layer, said dielectric layer and the dielectric of said storage capacitor being laid simultaneously.

4. The method of claim 3, wherein said step of forming said third layer includes:
    forming said upper capacitor electrode and a second electrode of said storage capacitor simultaneously in a same plane.

5. The method of claim 4, wherein said lower capacitor electrode and the first electrode of said storage capacitor are made from a same material selected from a group consisting of Pt, Ir, $IrO_2$, $RuO_2$, and $SrRuO_3$.

6. The method of claim 3, further comprising:
    wherein said step of depositing said upper capacitor electrode is performed by a damascene process.

7. The method of claim 6, further comprising:
    etching a hole through said upper capacitor electrode and said dielectric layer, said etching step stopping at a top surface of said lower capacitor electrode; and
    filling said hole with a conductive material to form a stud for connecting said lower capacitor electrode with said second signal line.

8. The method of claim 7, further comprising:
    depositing a third signal line and a fourth signal line on said third layer; and
    connecting said third signal line and said fourth signal line through said upper capacitor electrode.

9. The method of claim 1, wherein said memory cell is a DRAM memory cell.

* * * * *